United States Patent
Jiao et al.

(10) Patent No.: US 10,777,996 B2
(45) Date of Patent: Sep. 15, 2020

(54) ELECTRONIC OVERLOAD BREAKER WITH BUILT-IN SHUNT CALIBRATION (BISC) AND METHODS OF OPERATING SAME

(71) Applicant: Eaton Intelligent Power Limited, Dublin (IE)

(72) Inventors: Jian Jiao, Sewickley, PA (US); Jason Kohei Okerman, Pittsburgh, PA (US); Sandy Omar Jimenez, Monaca, PA (US)

(73) Assignee: Eaton Intelligent Power Limited, Dublin (IE)

( * ) Notice: Subject to any disclaimer, the term of this patent is extended or adjusted under 35 U.S.C. 154(b) by 319 days.

(21) Appl. No.: 15/883,408

(22) Filed: Jan. 30, 2018

(65) Prior Publication Data
US 2019/0237961 A1  Aug. 1, 2019

(51) Int. Cl.
*H02H 3/00* (2006.01)
*H02H 3/087* (2006.01)
*G01R 15/14* (2006.01)
*G01R 19/00* (2006.01)
*G01R 31/319* (2006.01)
*G01R 31/50* (2020.01)

(52) U.S. Cl.
CPC .......... *H02H 3/087* (2013.01); *G01R 15/146* (2013.01); *G01R 19/0092* (2013.01); *G01R 31/3191* (2013.01); *G01R 31/50* (2020.01)

(58) Field of Classification Search
None
See application file for complete search history.

(56) References Cited

U.S. PATENT DOCUMENTS

| | | | | | |
|---|---|---|---|---|---|
| 3,852,660 | A | * | 12/1974 | Maier | H02H 3/044 324/424 |
| 4,663,606 | A | * | 5/1987 | Carbone | H01H 37/28 337/368 |
| 9,411,003 | B2 | * | 8/2016 | Danesh | G01R 19/2506 |
| 9,638,724 | B2 | * | 5/2017 | Hurwitz | G01R 19/0092 |

(Continued)

OTHER PUBLICATIONS

Abirami et al., "Electronic Circuit Breaker for Overload Protection", *2016 International Conference on Computation of Power, Energy Information and Communication (ICCPEIC)*, Chennai, India, Apr. 20-21, 2016, 4 pp.

(Continued)

*Primary Examiner* — Stephen W Jackson
(74) *Attorney, Agent, or Firm* — Myers Bigel, P.A.

(57) ABSTRACT

An electronic overload current breaker supports arc-fault and ground-fault (AFGF) detection along with built-in shunt calibration (BISC™). The breaker may include a current sensing shunt and a control circuit electrically coupled to the current sensing shunt. This control circuit is configured to calibrate the current sensing shunt in response to application of a calibration current to the breaker. The control circuit can: (i) determine a magnitude of the calibration current applied to the breaker, (ii) map the magnitude of the calibration current to a first one of a plurality of current ratings for the breaker, and (iii) set the breaker to monitor overload conditions at the first one of the plurality of current ratings. The plurality of current ratings for the breaker can be less than the magnitude of the calibration current.

17 Claims, 5 Drawing Sheets

(56) References Cited

U.S. PATENT DOCUMENTS

2016/0181866 A1\* 6/2016 Moeskops ............... H02H 3/08
710/313

OTHER PUBLICATIONS

Deokar et al., "Ultra Fast Acting Electronic Circuit Breaker for Overload Protection", *3$^{rd}$ International Conference on Advances in Electrical, Electronics, Information, Communication and Bio-Informatics (AEEIB17)*, Chennai, India, Feb. 27-28, 2017, 5 pp.

Eaton Corporation, "Type BR (1-inch) dual purpose arc fault/ground fault circuit interrupter", Technical Data TD003005EN, Sep. 2014, 4 pp.

\* cited by examiner

ELECTRONIC OVERLOAD BREAKER WITH BUILT-IN SHUNT CALIBRATION (BISC) AND METHODS OF OPERATING SAME

FIELD OF THE INVENTION

The present invention relates to electrical circuit breakers and, more particularly, to electronic overload breakers and methods of operating same.

BACKGROUND OF THE INVENTION

Circuit breakers are electronic switches, which are typically automatically activated to prevent damage to circuits and equipment in response to the occurrence of short circuits and/or overload conditions therein. As illustrated by FIG. 1, a conventional circuit breaker may be configured as a dual-purpose arc fault/ground fault (AFGF) interrupter 10, which can be used in a single-pole 120 $V_{AC}$ load application 100 that is powered by 120/240 $V_{AC}$ source. As shown, the interrupter 10 includes four terminals, with terminal 1 connected to the 120/240 $V_{AC}$ source, terminals 2 and 3 connected to a load (e.g., 120 $V_{AC}$ receptacle 12) and terminal 4 electrically connected (e.g., pigtail) to a loadcenter neutral.

Other conventional circuit breakers, such as mechanically operated circuit breakers (MCBs), may operate relatively slowly by using a thermal bimetal lever as a trip mechanism and this relatively slow operation may result in damage to the circuits and equipment. To address this slow speed limitation associated with conventional MCBs, electronic circuit breakers (ECBs) have been developed to achieve higher speed trip mechanisms for use with sensitive loads. For example, in a conventional ECB, a load current passes through a series element (i.e., shunt) having a very low resistance, and a voltage drop across the series element and a preset voltage may be compared in a level comparator. Then, in the presence of an excessive series voltage drop (i.e., shunt voltage), the comparator may generate an output signal to a microcontroller, which may then trigger a current controlling relay at high speed to thereby terminate an overload condition. These and other aspects of conventional ECBs are disclosed in an article by T. Deokar et al., entitled "Ultra Fast Acting Electronic Circuit Breaker for Overload Protection," 2017 *Third International Conference on Advances in Electrical, electronics, Information, Communication and Bio-Informatics (AEEICB)*, Chennai, India, (2017) pp. 29-32, and in article by P. Abirami et al., entitled "Electronic Circuit Breaker for Overload Protection," 2016 *International Conference on Computation of Power, Energy Information and Communication (ICCPEIC)*, Chennai, India, (2016) pp. 773-776.

As will be understood by those skilled in the art, the use of a low resistance shunt (e.g., 0.5 mΩ) to sense load current in an electronic overload breaker provides many advantages. For example, relative to a conventional current transducer (CT), a shunt can sense DC and very high frequency currents, does not saturate, is relatively inexpensive and typically only requires a small layout space. Nonetheless, the accuracy of the trip performance in shunt-based electronic overload breakers can be limited because variations in shunt resistance can often be significant at levels of ±10% or higher.

SUMMARY OF THE INVENTION

An electronic overload current breaker according to some embodiments of the invention includes a current sensing shunt and a control circuit electrically coupled to the current sensing shunt. This control circuit is configured to, among other things, calibrate the current sensing shunt in response to application of a calibration current to the breaker during a calibration time interval. In some of these embodiments, the control circuit is configured to: (i) determine a magnitude of the calibration current applied to the breaker, (ii) map the magnitude of the calibration current to a first one of a plurality of current ratings for the breaker, and (iii) set the breaker to monitor overload conditions at the first one of the plurality of current ratings. The plurality of current ratings for the breaker can be less than the magnitude of the calibration current.

According to additional embodiments of the invention, the control circuit is configured to determine the magnitude of the calibration current in response to application of a multi-stage (and multi-level) current to the breaker during the calibration time interval. For example, the application of the multi-stage current to the breaker may include application of a first DC current having a first magnitude (e.g., 15 A) followed by a second DC current having a second magnitude (e.g., 37.5 A, 50 A or 75 A), which is greater than the first magnitude. Preferably, these first and second DC currents pass through the current sensing shunt during the calibration time interval, so that the control circuit can measure first and second DC voltages (appearing across the shunt) and then determine the magnitude of the calibration current from the first and second DC voltages. The control circuit is also configured to determine the magnitude of the calibration current in response to the breaker receiving the calibration current (as a DC current) concurrently with an AC voltage during the calibration time interval. According to preferred aspects of these embodiments of the invention, the AC voltage has a magnitude within a range from about 0.4 to about 0.6 times a voltage rating of the breaker, which means the AC voltage applied during calibration will not typically be encountered during normal field-based operation of the electronic overload breaker.

According to additional embodiments of the invention, an overload current breaker is provided with a current sensing shunt and a control circuit electrically coupled to the current sensing shunt. The control circuit is configured to calibrate the current sensing shunt by measuring a calibration voltage appearing across the shunt in response to passing a DC calibration current through the shunt during a calibration time interval. This passing of the DC calibration current through the shunt (during a calibration time interval) is preferably performed concurrently with applying, to the breaker, an AC voltage having a magnitude in a range from about 0.4 to about 0.6 times a voltage rating of the breaker. In particular, the control circuit is configured to calibrate the shunt by measuring first and second voltages appearing across the shunt in response to passing first and second unequal DC currents, in sequence, through the shunt during the calibration time interval. The control circuit is also configured to map the second measured voltage to one of a plurality of current ratings for the breaker. These plurality of current ratings can be less than a magnitude of the second DC current.

According to still further embodiments of the invention, a method of operating an electronic overload current breaker includes applying a DC calibration current and a calibration voltage to the breaker during a calibration time interval, and then determining, internal to the breaker, a magnitude of the DC calibration current. The breaker is then calibrated at a current rating associated with the DC calibration current. The applying of the DC calibration current may include applying a multi-stage DC calibration current to the breaker (and to an internal current sensing shunt) during the calibration time interval concurrently with an AC calibration voltage. This multi-stage DC calibration current may include a calibration current having a magnitude greater than the current rating of the breaker. The AC calibration voltage may also have a magnitude in a range from about 0.4 to about 0.6 times a voltage rating of the breaker.

In particular, the multi-stage DC calibration current may include a current at a first current level below a maximum current rating of the breaker (during a first portion of the calibration time interval) and then a current at a second current level above the maximum current rating of the breaker (during a second portion of the calibration time interval). Operations to calibrate the breaker may also include calibrating the internal current sensing shunt by measuring a voltage appearing across the current sensing shunt, in response to passing the DC calibration current through the current sensing shunt, and then calculating and storing a calibration coefficient that translates the nominal resistance of the current sensing shunt to an actual resistance of the current sensing shunt. This calibration coefficient may be stored within a nonvolatile memory (e.g., EEPROM) within the microprocessor-based control circuit.

DETAILED DESCRIPTION OF EMBODIMENTS

Figure 1:
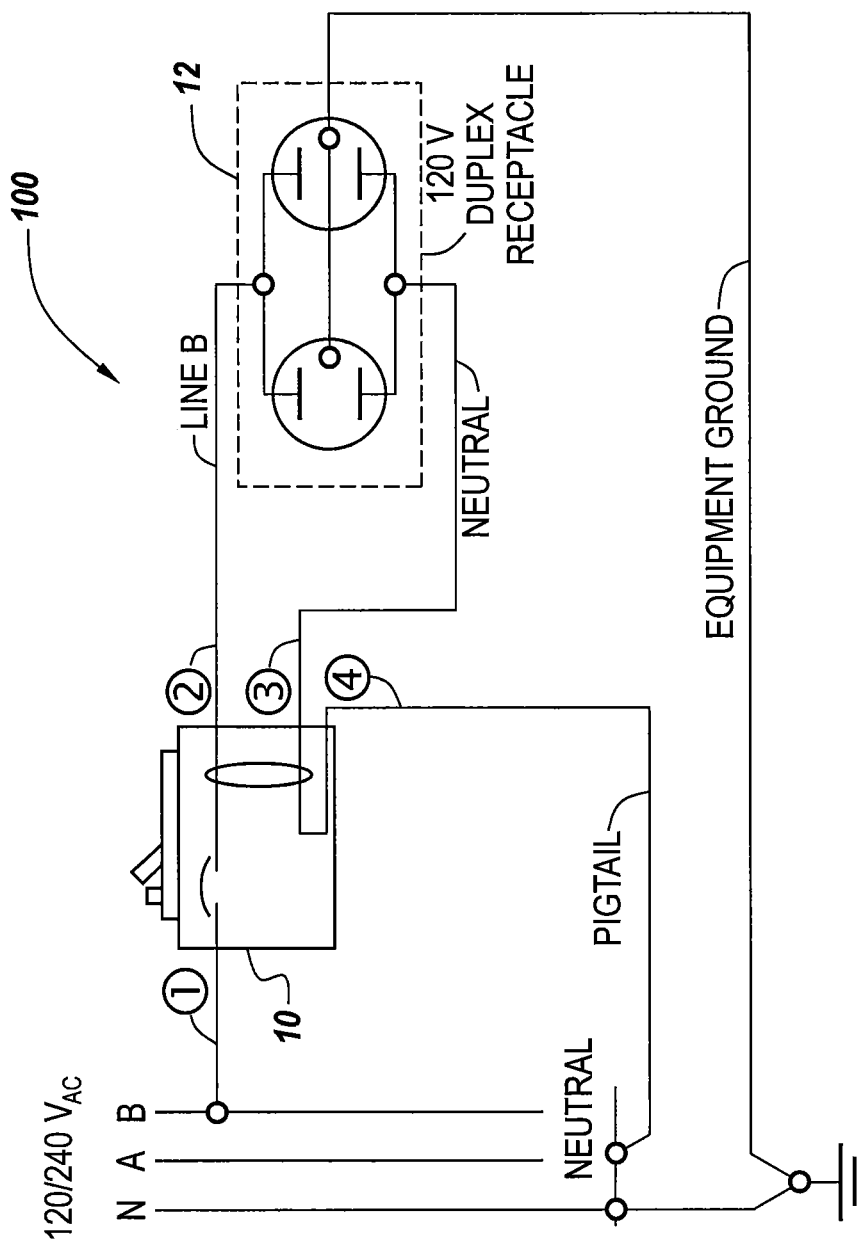
FIG. 1 is an electrical schematic of a conventional dual-purpose arc fault/ground fault circuit interrupter.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
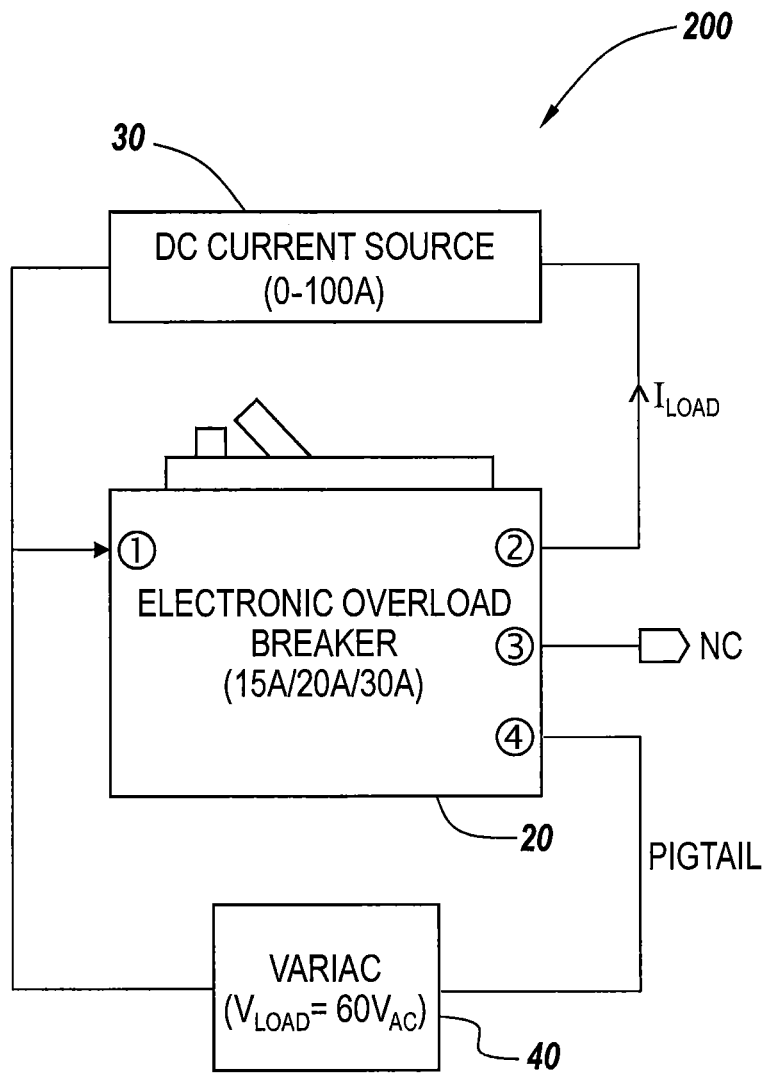
FIG. 2A is a block diagram of a test apparatus for an electronic overload breaker according to embodiments of the present invention.

Referring now to FIG. 2A, a test apparatus 200 for a four-terminal electronic overload breaker 20 is illustrated as including a current source 30 and a voltage source 40, which may be used concurrently to support built-in shunt calibration (BISC™) within the breaker 20 during post-manufacture reliability testing and configuration at one of a plurality of supported current ratings (e.g., 15 A, 20 A or 30 A). As shown, the current source 30 is variable DC current source, which is connected across terminals 1 and 2 of the breaker 20, and the voltage source 40 is an AC voltage source, which is connected across terminals 1 and 4 of the breaker 20. Terminal 3 of the breaker 20, which is typically connected to a neutral terminal of a load during normal operation (see, e.g., FIG. 1) may be disconnected (NC) during calibration and configuration. This concurrent application of a DC current source and an AC voltage source can be utilized to automatically induce, within the breaker 20, a configuration and calibration mode of operation (without requiring additional terminals), because these conditions (DC current, low AC voltage) will not be encountered during normal operation of the breaker, which assumes an AC rated source voltage and corresponding AC load voltage and current.

As described more fully hereinbelow, the current source 30 is configured to provide a multi-stage and multi-level DC calibration current ($I_C$) into terminal 1 of the breaker 20 during calibration and configuration, whereas the AC voltage source 40 is configured to provide a reduced magnitude AC voltage across terminals 1 and 4 of the breaker 20. This AC voltage may have a magnitude of 60 $V_{AC}$, which is about 0.5 times a voltage rating of the breaker 20 (e.g., 120$V_{AC}$). The AC voltage source may be a Variac and may be set (during calibration) to a voltage in a range from about 0.3 to about 0.7 times the voltage rating of the breaker 20 and, more preferably, in a range from about 0.4 to about 0.6 times the voltage rating of the breaker 20 (e.g., 48-72 $V_{AC}$).

Figure 2B:
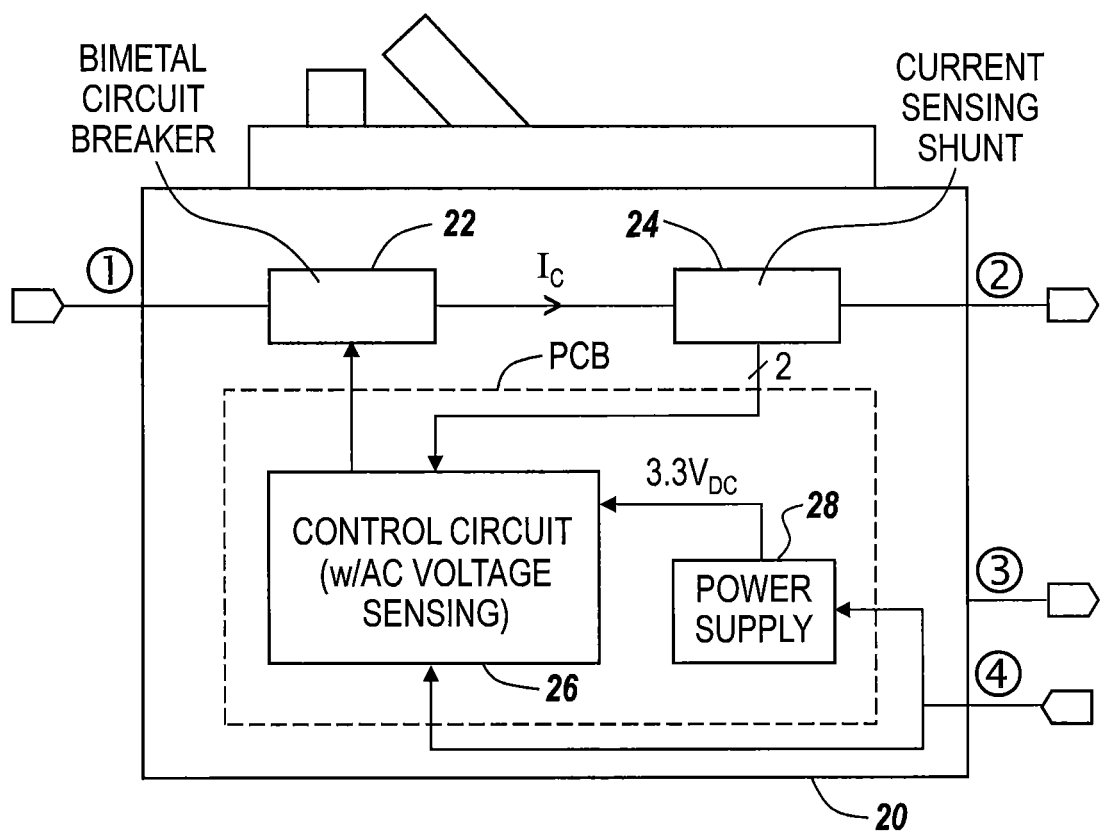
FIG. 2B is a block diagram of a electronic overload breaker according to embodiments of the present invention.

Referring now to FIG. 2B, the electronic overload breaker 20 of FIG. 2A is further illustrated as including a bimetal circuit breaker 22 and low resistance current sensing shunt 24, which are electrically connected in series between terminals 1 and 2 to thereby receive the DC calibration current ($I_C$), and a control circuit 26 (with AC voltage sensing circuitry). Among other things, the control circuit 26 controls calibration and configuration operations during a multi-staged calibration time interval, as described herein. This control circuit 26 and corresponding power supply 28 (e.g., 3.3 $V_{DC}$) may be provided on a printed circuit board (PCB) within the breaker 20. The control circuit 26 and power supply 28 receive a "reduced" AC voltage signal provided to terminal 4 of the breaker 20. According to some embodiments of the invention, the control circuit 26 may include a microprocessor, memory (e.g., EEPROM), a bimetal actuator (e.g., solenoid) that is coupled to the bimetal circuit breaker 22, and shunt voltage measurement circuitry, which may receive a pair of signals from the current sensing shunt 24 so that a shunt voltage can be determined in response to the DC calibration current $I_C$.

During calibration and configuration of the breaker 20, the current source 30 provides the DC calibration current ($I_C$) as a multi-stage and multi-level current and the control circuit 26 measures multiple voltages developed across the current sensing shunt 24, to thereby determine the value of $I_C$ and an accurate value of shunt resistance ($R_{shunt}$) associated with the current sensing shunt 24. For example, if the breaker 20 is to be configured as a 15 A breaker, then a first stage 15 A current $I_C$ is provided during a first portion of a calibration time interval (e.g., $0-t_1$) and then a second stage current $I_C$ of 37.5 A (i.e., 250% of 15 A) is provided during a second portion of the calibration time interval beginning at $t_1$. Alternatively, if the breaker 20 is to be configured as a 20 A breaker, then a first stage 15 A current $I_C$ is provided during the first portion of the calibration time interval (e.g., $0-t_1$) and then a second stage current $I_C$ of 50 A (i.e., 250% of 20 A) is provided during the second portion of the calibration time interval beginning at $t_1$. Finally, if the breaker 20 is to be configured as a 30 A breaker, then a first stage 15 A current $I_C$ is provided during the first portion of the calibration time interval (e.g., $0-t_1$) and then a second stage current $I_C$ of 75 A (i.e., 250% of 30 A) is provided during the second portion of the calibration time interval beginning at $t_1$.

Accordingly, if the nominal/rated value of $R_{shunt}$ is 0.5 mΩ (±10%), then a first voltage ($V1_{DC}$) developed across the current sensing shunt 24 during the first portion of the calibration time interval will be measured by the control circuit 26 as 7.5 mV (±0.75 mV) and a second voltage ($V2_{DC}$) developed across the current sensing shunt 24 during the second portion of the calibration time interval will be measured by the control circuit 26 as 18.75 mV (±1.875 mV), for a breaker 20 being configured as a 15 A breaker. Alternatively, if the breaker 20 is to be configured as a 20 A breaker, then the first voltage $V1_{DC}$ will be measured as 7.5 mV (±0.75 mV) and the second voltage $V2_{DC}$ will be measured as 25 mV (±2.5 mV). Finally, if the breaker 20 is to be configured as a 30 A breaker, then the first voltage $V1_{DC}$ will be measured as 7.5 mV (±0.75 mV) and the second voltage $V2_{DC}$ will be measured as 37.5 mV (±3.75 mV).

Figure 3A:
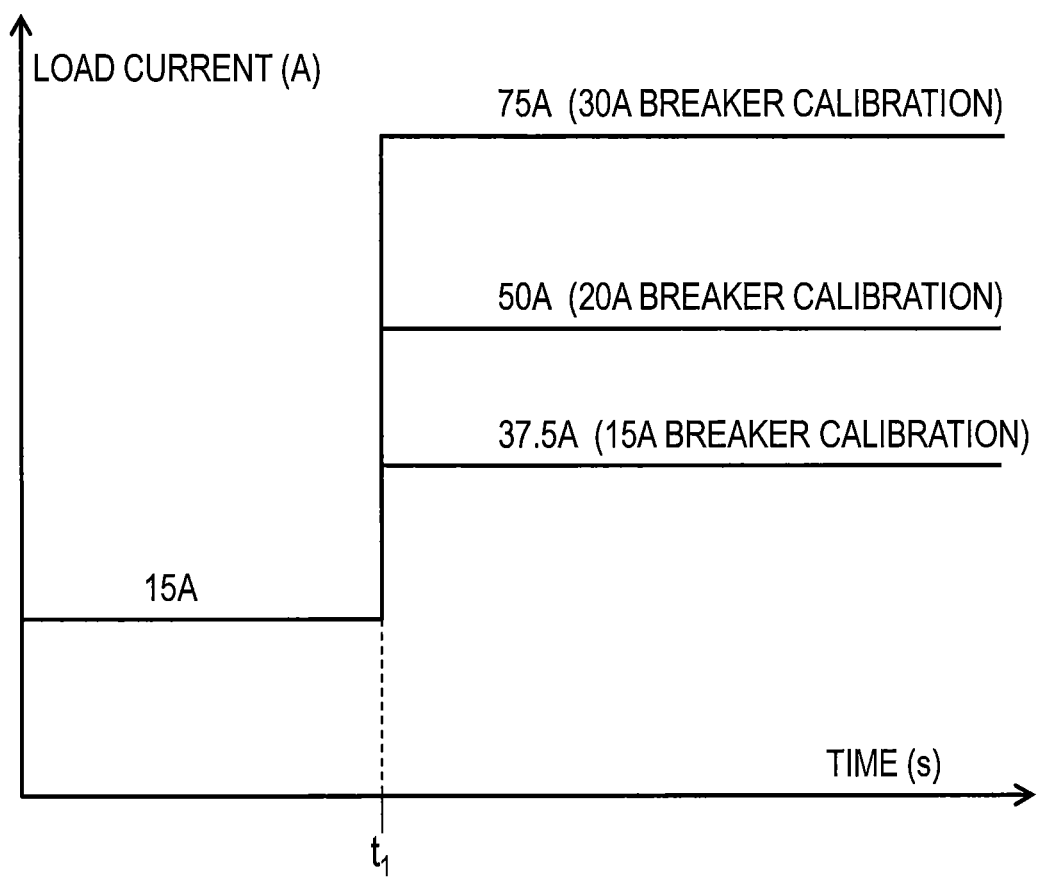
FIGS. 3A-3B are timing and flow diagrams that illustrate calibration operations performed by the test apparatus and electronic overload breaker of FIGS. 2A-2B, according to embodiments of the present invention.
Figure 3B:
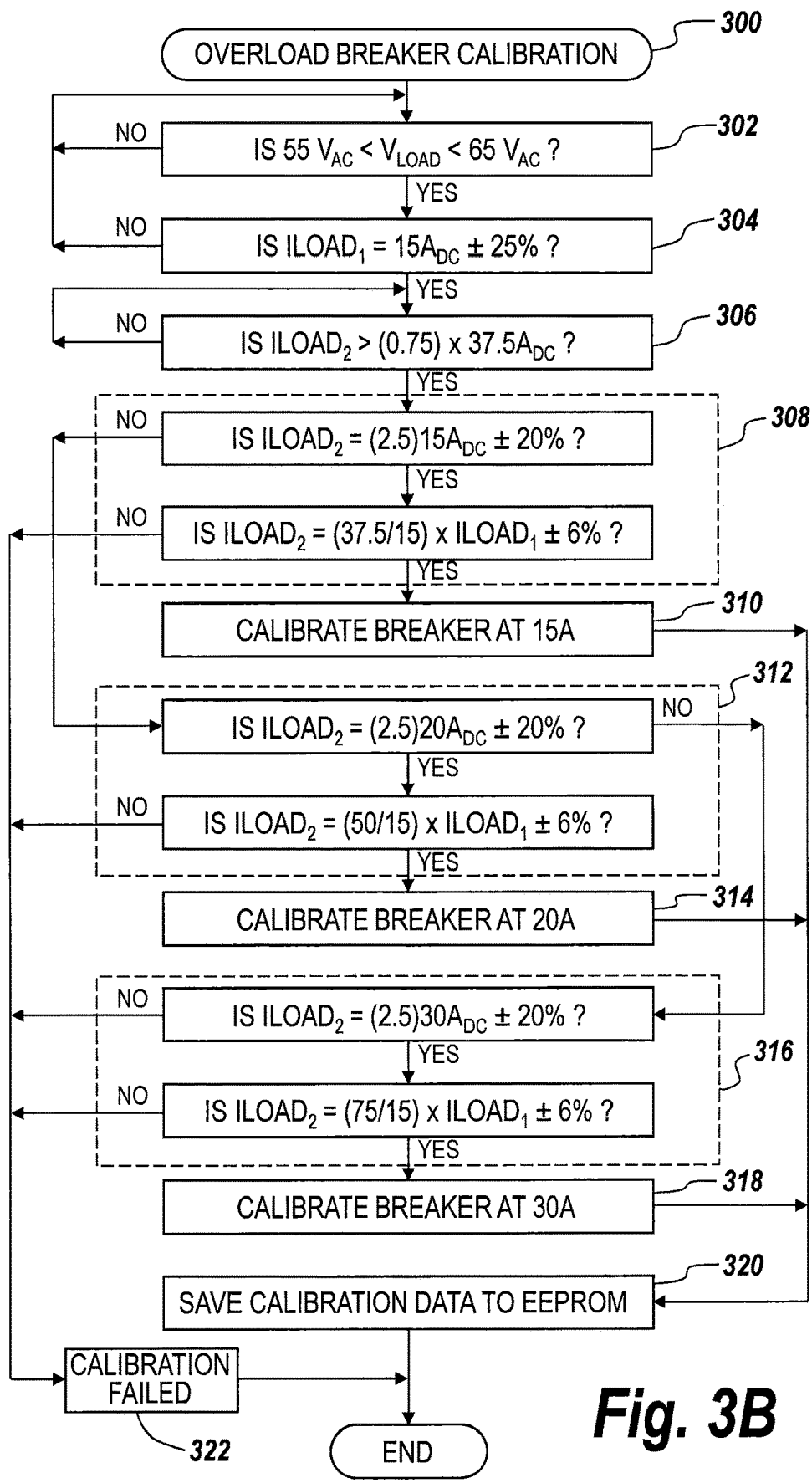

In addition, as shown by FIG. 3B, the control circuit 26 may uses these direct measurements of the first and second voltages in combination with a "known" nominal/rated value of $R_{shunt}$ to thereby determine a first "measured" DC calibration current $I_{C1}$ as equal to $I_{LOAD1}$ (measured), where $I_{LOAD1}=V1_{DC}/R_{shunt}$, and determine a second "measured" DC calibration current $I_{C2}$ as equal to $I_{LOAD2}$ (measured), where $I_{LOAD2}=V2_{DC}/R_{shunt}$. Then, by comparing $I_{C1}=15$ A (actual) to $I_{LOAD1}$ (measured) and by comparing $I_{C2}=37.5$ A, 50 A or 75 A (actual) to $I_{LOAD2}$ (measured), a more accurate "calibrated" value of $R_{shunt}$ (i.e., $R_{shunt}$ (actual)) can be deduced along with a desired configuration (e.g., 15 A, 20 or 30 A rating) of the breaker 20, with relatively minimal computational expense within the control circuit 26. This more accurate "calibrated" value of $R_{shunt}$ (actual) or a dimensionless coefficient that translates $R_{shunt}$ (nominal) to $R_{shunt}$ (actual) may be stored within a memory (e.g., EEPROM) within the control circuit 26, to thereby provide more accurate electronic overload detection within the breaker 20 during post-installation field use.

In particular, as shown in detail by FIGS. 3A-3B, operations 300 for performing overload breaker calibration (and configuration) according to an embodiment of the invention may include an initial detection of a reduced AC voltage associated with the voltage source 40, which is treated by the breaker 20 as a load voltage, Block 302. As shown by FIGS. 2A-2B, the voltage level of the reduced AC voltage generated by the voltage source 40 (e.g., Variac) may be determined by AC voltage sensing circuitry within the control circuit 26, using voltage measurement techniques known to those skilled in the art.

Upon detection of a reduced AC voltage, a check is then made to determine whether a 15 A DC current ($I_C=I_{LOAD}=15$ A) is being provided to the breaker 20 concurrently with the reduced AC voltage during a first portion of a calibration time interval, Block 304.

Thereafter, as shown by Block 306, a further check is then made to determine whether a sufficiently large DC current (i.e., $I_C=I_{LOAD}>0.75$ (37.5 A)) is being provided to the breaker 20 during a second portion of a calibration time interval. This further check is then followed by a series of alternative and more detailed checks as shown by Blocks 308, 312 and 316, which correspond to three distinct current calibrations and configurations at levels of 15 A, 20 A or 30 A, respectively. As shown by Blocks 310 and 320, if the conditions of Block 308 are met, $R_{SHUNT}$ and the breaker 20 are calibrated at a 15 A current rating. Or, as shown by Blocks 314 and 320, if the conditions of Block 312 are met, $R_{SHUNT}$ and the breaker 20 are calibrated at a 20 A current rating. Or, finally, as shown by Blocks 318 and 320, if the conditions of Block 316 are met, $R_{SHUNT}$ and the breaker 20 are calibrated at a 30 A current rating. However, if none of these conditions are met, a failed calibration condition can be established within the breaker 20, Block 322, and possibly announced with a visual and/or audible notification within the test apparatus 200.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An overload current breaker, comprising:
   a current sensing shunt; and
   a control circuit electrically coupled to said shunt, said control circuit configured to calibrate said shunt in response to application of a calibration current to the breaker during a calibration time interval, said calibration current having a magnitude that exceeds a maximum current rating of the overload current breaker during at least a portion of the calibration time interval.

2. The breaker of claim 1, wherein said control circuit is configured to determine a magnitude of the calibration current applied to the breaker.

3. The breaker of claim 2, wherein said control circuit is configured to map the magnitude of the calibration current to a first one of a plurality of current ratings for the breaker and set the breaker at the first one of the plurality of current ratings.

4. The breaker of claim 2, wherein said control circuit is configured to determine the magnitude of the calibration current in response to application of a multi-stage current to the breaker during the calibration time interval.

5. An overload current breaker, comprising:
a current sensing shunt; and
a control circuit electrically coupled to said shunt, said control circuit configured to calibrate said shunt in response to application of a calibration current to the breaker during a calibration time interval; and
wherein said control circuit is configured to determine a magnitude of the calibration current in response to application of a multi-stage current to the breaker during the calibration time interval, which includes application of a first DC current having a first magnitude followed by a second DC current having a second magnitude greater than the first magnitude.

6. The breaker of claim 5, wherein the first and second DC currents pass through said shunt during the calibration time interval.

7. The breaker of claim 6, wherein said control circuit is configured to measure first and second DC voltages appearing across said shunt during the calibration time interval, and determine the magnitude of the calibration current from the first and second DC voltages.

8. An overload current breaker, comprising:
a current sensing shunt; and
a control circuit electrically coupled to said shunt, said control circuit configured to calibrate said shunt in response to a concurrent application of a DC calibration current and an AC voltage to the breaker during a calibration time interval.

9. The breaker of claim 8, wherein the AC voltage has a magnitude in a range from about 0.4 to about 0.6 times a voltage rating of the breaker.

10. An overload current breaker, comprising:
a current sensing shunt; and
a control circuit electrically coupled to said shunt, said control circuit configured to calibrate said shunt by measuring a calibration voltage appearing across said shunt in response to passing a DC calibration current through said shunt during a calibration time interval;
wherein the passing of the DC calibration current through said shunt during a calibration time interval is performed concurrently with applying to the breaker an AC voltage having a magnitude in a range from about 0.4 to about 0.6 times a voltage rating of the breaker.

11. An overload current breaker, comprising:
a current sensing shunt; and
a control circuit electrically coupled to said shunt, said control circuit configured to calibrate said shunt by measuring a calibration voltage appearing across said shunt in response to passing a DC calibration current through said shunt during a calibration time interval;
wherein said control circuit is configured to calibrate said shunt by measuring first and second voltages appearing across said shunt in response to passing first and second unequal DC currents, in sequence, through said shunt during the calibration time interval.

12. The breaker of claim 11, wherein said control circuit is configured to map the second measured voltage to one of a plurality of current ratings for the breaker.

13. The breaker of claim 12, wherein the plurality of current ratings for the breaker are less than a magnitude of the second DC current.

14. An electronic overload breaker, comprising:
a current sensing shunt; and
a control circuit electrically coupled to said shunt, said control circuit configured to perform built-in calibration of said current sensing shunt in response to concurrent application of a DC current and an AC voltage to the breaker during the calibration time interval.

15. The breaker of claim 14, wherein the AC voltage has a magnitude less than a voltage rating of the breaker.

16. The breaker of claim 15, wherein said control circuit comprises AC voltage sensing circuitry therein.

17. The breaker of claim 14, wherein said control circuit comprises AC voltage sensing circuitry therein.

* * * * *